(12) United States Patent
Watanabe

(10) Patent No.: US 9,614,094 B2
(45) Date of Patent: Apr. 4, 2017

(54) SEMICONDUCTOR DEVICE INCLUDING OXIDE SEMICONDUCTOR LAYER AND METHOD FOR DRIVING THE SAME

(75) Inventor: Kazunori Watanabe, Atsugi (JP)

(73) Assignee: SEMICONDUCTOR ENERGY LABORATORY CO., LTD., Kanagawa-ken (JP)

(*) Notice: Subject to any disclaimer, the term of this patent is extended or adjusted under 35 U.S.C. 154(b) by 1211 days.

(21) Appl. No.: 13/453,180

(22) Filed: Apr. 23, 2012

(65) Prior Publication Data
US 2012/0274401 A1 Nov. 1, 2012

(30) Foreign Application Priority Data

Apr. 29, 2011 (JP) ................... 2011-102549

(51) Int. Cl.
*H01L 29/10* (2006.01)
*H01L 29/786* (2006.01)

(52) U.S. Cl.
CPC ........... *H01L 29/7869* (2013.01); *H03F 2203/45138* (2013.01)

(58) Field of Classification Search
CPC .... H02M 1/38; H02M 1/4208; H02M 1/4225; H02M 2001/0006
(Continued)

(56) References Cited

U.S. PATENT DOCUMENTS 5,731,856 A 3/1998 Kim et al.
5,736,879 A * 4/1998 Pham ........................ H03K 9/06
327/102

(Continued)

FOREIGN PATENT DOCUMENTS

EP 1246457 A 10/2002
EP 1737044 A 12/2006
(Continued)

OTHER PUBLICATIONS

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. 85, No. 13, pp. 2541-2543.
(Continued)

*Primary Examiner* — Adolf Berhane
*Assistant Examiner* — Afework Demisse
(74) *Attorney, Agent, or Firm* — Robinson Intellectual Property Law Office; Eric J. Robinson

(57) ABSTRACT

An object is to suppress operation delay caused when a semiconductor device that amplifies and outputs an error between two potentials returns from a standby mode. Electrical connection between an output terminal of a transconductance amplifier and one electrode of a capacitor is controlled by a transistor whose channel is formed in an oxide semiconductor layer. Consequently, turning off the transistor allows the one electrode of the capacitor to hold charge for a long time even if the transconductance amplifier is in the standby mode. Moreover, when the transconductance amplifier returns from the standby mode, turning on the transistor makes it possible to settle charging and discharging of the capacitor in a short time. As a result, the operation of the semiconductor device can enter into a steady state in a short time.

20 Claims, 10 Drawing Sheets

(58) Field of Classification Search
USPC .............. 323/222, 223, 282, 284, 285, 351
See application file for complete search history.

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,420,857 | B2 | 7/2002 | Fukui |
| 6,563,174 | B2 | 5/2003 | Kawasaki et al. |
| 6,727,522 | B1 | 4/2004 | Kawasaki et al. |
| 6,907,536 | B2 | 6/2005 | Takahashi et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,084,700 | B2 | 8/2006 | Haraguchi et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,362,083 | B2 * | 4/2008 | Scoones ............... H02M 3/158 323/284 |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,378,341 | B2 | 2/2013 | Hayashi et al. |
| 8,878,172 | B2 | 11/2014 | Ito et al. |
| 9,111,806 | B2 | 8/2015 | Ito et al. |
| 9,129,937 | B2 | 9/2015 | Hayashi et al. |
| 9,312,394 | B2 | 4/2016 | Hayashi et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296567 | A1 * | 12/2008 | Irving ............... H01L 21/02554 257/43 |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0308654 | A1 * | 12/2010 | Chen ............... H02M 3/1584 307/31 |
| 2011/0062432 | A1 | 3/2011 | Yamazaki et al. |
| 2011/0304311 | A1 * | 12/2011 | Takahashi ......... H01L 27/1225 323/311 |
| 2016/0211173 | A1 | 7/2016 | Hayashi et al. |

FOREIGN PATENT DOCUMENTS

| | | |
|---|---|---|
| EP | 2226847 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-086739 A | 3/2001 |
| JP | 2001-282372 A | 10/2001 |
| JP | 2002-076356 A | 3/2002 |
| JP | 2002-289859 A | 10/2002 |
| JP | 2002-300479 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-094572 A | 4/2006 |
| JP | 2008-109610 A | 5/2008 |
| JP | 2010-103360 A | 5/2010 |
| JP | 2010-141230 A | 6/2010 |
| JP | 2011-086927 A | 4/2011 |
| WO | WO-2004/093311 | 10/2004 |

(56) References Cited

FOREIGN PATENT DOCUMENTS

| WO | WO-2004/114391 | 12/2004 |
|---|---|---|
| WO | WO-2011/033911 | 3/2011 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.
Ikeda.T et al., "Full-Functional System Liquid Crystal Display Using CG-Silicon Technology,", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters) , Jun. 17, 1996, vol. 68, No. 25, pp. 3650-3652.
Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630).
Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for Amoled Back-Plane,", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTs,", IDW '09 : Proceedings of the 16th International Display Workshops, 2009, pp. 689-692.
Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.
Osada.T et al., "Development of Driver-Integrated Panel Using Amorphous In—Ga—Zn-Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT,",

(56) References Cited

OTHER PUBLICATIONS

SID Digest '09 : SID International Symposium Digest of Technical Papers, May 31, 2009, pp. 1110-1112.

Ohara.H at al., "21.3:4.0 In. QVGA AMOLED Display Using In—Ga—Zn-Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) ,2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

FIG. 3A
FIG. 3B
FIG. 3C
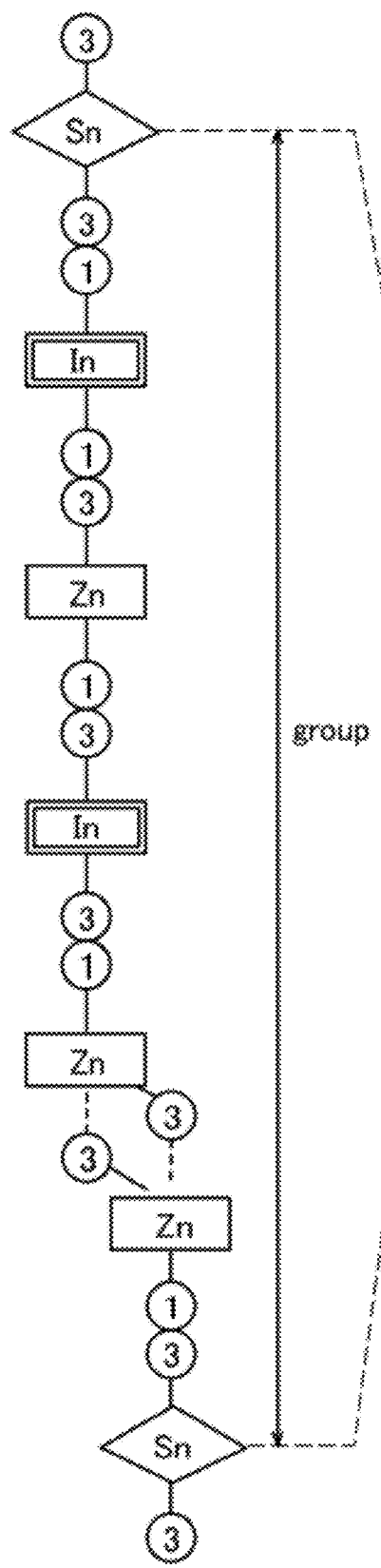
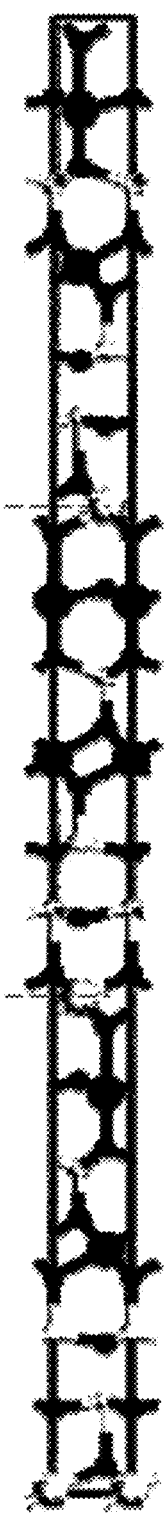
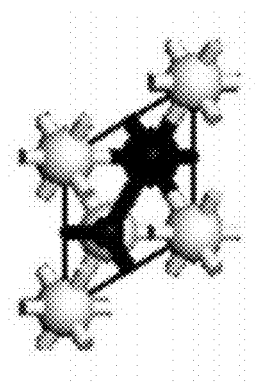
● In
☾ Sn
⟨ Zn
• O

SEMICONDUCTOR DEVICE INCLUDING OXIDE SEMICONDUCTOR LAYER AND METHOD FOR DRIVING THE SAME

BACKGROUND OF THE INVENTION

1. Field of the Invention

The present invention relates to a semiconductor device that amplifies and outputs an error (a difference) between two signals and a method for driving the semiconductor device. The present invention particularly relates to the semiconductor device having a function of stopping its operation (a standby function) and a method for driving the semiconductor device. Note that in this specification, a semiconductor device refers to any device that operates by utilizing semiconductor properties.

2. Description of the Related Art

The rise of environmental awareness requires the reduction in power consumption of a variety of semiconductor devices. For example, Patent Document 1 discloses a technique for reducing power consumption of a multiple frequency switching power supply having a pulse width modulation circuit (a power supply circuit controlled by a pulse width modulation (PWM) method). Specifically, the power supply changes the frequency of a clock signal supplied to the pulse width modulation circuit in accordance with whether the pulse width modulation circuit is in a normal operation mode or a waiting (standby) mode, thereby reducing power consumption.

REFERENCE

Patent Document 1: Japanese Published Patent Application No. 2001-086739

SUMMARY OF THE INVENTION

A semiconductor device that amplifies and outputs an error between two potentials (an error amplifier) is known. An error amplifier has a wide variety of applications depending on its purpose. For example, the above-described power supply circuit controlled by a pulse width modulation method can be formed using an error amplifier.

FIG. 10 illustrates an example of a configuration of a DC-DC converter included in the power supply circuit. The DC-DC converter illustrated in FIG. 10 includes a power conversion unit 1, an output detection unit 2, and a control circuit unit 3. Here, the power supply circuit in FIG. 10 is a DC-DC converter that converts a direct-current voltage (Vin) input to the power conversion unit 1 from an external unit into a direct-current voltage (Vout). The output detection unit 2 has a function of detecting a feedback signal by using the direct-current voltage (Vout). The control circuit unit 3 has a function of controlling power conversion in the power conversion unit 1 in accordance with the feedback signal.

Specifically, the power conversion unit 1 includes a switch 11, a diode 12, an inductor 13, and a capacitor 14. One terminal of the switch 11 is electrically connected to a terminal to which the direct-current voltage (Vin) is input. An anode of the diode 12 is electrically connected to a terminal to which a ground potential is input. A cathode of the diode 12 is electrically connected to the other terminal of the switch 11. One end of the inductor 13 is electrically connected to the other terminal of the switch 11 and the cathode of the diode 12. The other end of the inductor 13 is electrically connected to a terminal from which the direct-current voltage (Vout) is output. One electrode of the capacitor 14 is electrically connected to the terminal from which the direct-current voltage (Vout) is output. The other electrode of the capacitor 14 is electrically connected to the terminal to which the ground potential is input.

The output detection unit 2 includes a resistor 21 and a resistor 22. One end of the resistor 21 is electrically connected to the terminal from which the direct-current voltage (Vout) is output. One end of the resistor 22 is electrically connected to the other end of the resistor 21. The other end of the resistor 22 is electrically connected to a terminal to which the ground potential is input.

The control circuit unit 3 includes an error amplifier 31, a pulse width modulator 32, a switch driving circuit 33, and a reference voltage generator 34. The error amplifier 31 includes a transconductance amplifier 311 and a capacitor 312. The pulse width modulator 32 includes a comparator 321 and a triangle wave oscillator 322.

An inverting input terminal (−) of the transconductance amplifier 311 is electrically connected to the other end of the resistor 21 and the one end of the resistor 22. A non-inverting input terminal (+) of the transconductance amplifier 311 is electrically connected to a wiring to which the reference voltage generator 34 supplies a reference voltage (Vref). One electrode of the capacitor 312 is electrically connected to an output terminal of the transconductance amplifier 311. The other electrode of the capacitor 312 is grounded. A non-inverting input terminal (+) of the comparator 321 is electrically connected to the output terminal of the transconductance amplifier 311 and the one electrode of the capacitor 312. An inverting input terminal (−) of the comparator 321 is electrically connected to a wiring to which the triangle wave oscillator 322 supplies a triangle wave. An input terminal of the switch driving circuit 33 is electrically connected to an output terminal of the comparator 321. Switching of the switch 11 is controlled by an output signal of the switch driving circuit 33.

Next, the operation of the DC-DC converter in FIG. 10 will be described below in detail.

The direct-current voltage (Vout), which is output from the power conversion unit 1, is supplied to an external load and is divided by the resistors 21 and 22 included in the output detection unit 2. The voltage divided by the resistors is input to the error amplifier 31 included in the control circuit unit 3 as a feedback signal. The error amplifier 31 amplifies an error between the feedback signal and the reference voltage, and outputs the amplified error as an error signal. The error signal is input to the comparator 321 included in the pulse width modulator 32. The comparator 321 outputs a binary signal based on comparison between the error signal and the triangle wave. The binary signal serves as a signal for controlling switching of the switch 11 through the switch driving circuit 33. In the power conversion unit 1, whether the direct-current voltage (Vin) is supplied is selected by the switch 11. In other words, power supplied to the power conversion unit 1 is controlled by the duty cycle indicating the time during which the switch 11 is on.

Simply stated, the DC-DC converter in FIG. 10 is a DC-DC converter controlled by feedback control with a pulse width modulation method (i.e., a step-down DC-DC converter controlled by a pulse width modulation method).

In the DC-DC converter illustrated in FIG. 10, the duty cycle, which indicates the time during which the switch 11 is on, is controlled in the control circuit unit 3 so that the direct-current voltage (Vout) can be kept constant regardless of the fluctuation of the direct-current voltage (Vout) due to the fluctuation of the impedance or the like of a load supplied with the direct-current voltage (Vin) or the direct-current voltage (Vout). Specifically, the fluctuation of the direct-current voltage (Vout) leads to the fluctuation of the feedback signal. Thus, an error occurs between the feedback signal and the reference voltage, and the capacitor 312 is charged and discharged in accordance with an output current of the transconductance amplifier 311 corresponding to the error. Then, the charging and discharging of the capacitor 312 causes the error signal to fluctuate. As a result, the duty cycle of the binary signal output from the comparator 321 is changed, thereby controlling the duty cycle, which indicates the time during which the switch 11 is on.

Note that this operation controls the feedback signal so that the feedback signal can be equal to the reference voltage, and finishes when the feedback signal becomes equal to the reference voltage. That is, the operation finishes when charging and discharging of the capacitor 312 is settled (ended or greatly reduced), and the error signal output from the error amplifier 31 is fixed (is in a steady state).

To reduce power consumption in the DC-DC converter in FIG. 10, it is effective to add a standby function to the error amplifier 31 or the like. Note that when the error amplifier 31 is in a standby mode, charge held in the one electrode of the capacitor 312 is lost through the transconductance amplifier 311 (the fixed error signal is lost). Accordingly, when the error amplifier 31 returns from the standby mode, the capacitor 312 is charged and discharged until the feedback signal becomes equal to the reference voltage. As a result, the operation is delayed before the direct-current voltage (Vout) reaches a desired value. On the other hand, the delay does not occur when the storage capacitance of the capacitor 312 is reduced or the capacitor 312 is eliminated in the DC-DC converter illustrated in FIG. 10. Note that the capacitor 312 is used to compensate the phase for feedback control. Therefore, the probability that an output of the DC-DC converter oscillates is increased, for example, when the storage capacitance of the capacitor 312 is reduced.

The above is an example of an object that is to be solved by one embodiment of the present invention. In short, an object of one embodiment of the present invention is to suppress operation delay caused when a semiconductor device that amplifies and outputs an error between two potentials returns from a standby mode.

A semiconductor device according to one embodiment of the present invention is characterized in that electrical connection between an output terminal of a transconductance amplifier and one electrode of a capacitor is controlled by a transistor whose channel is formed in an oxide semiconductor layer. Since an oxide semiconductor has a wide band gap and low intrinsic carrier density, an off-state current generated in the oxide semiconductor layer can be extremely low. Such features are unique to the oxide semiconductor and not shared by other semiconductors (e.g., silicon).

Specifically, one embodiment of the present invention is a semiconductor device for amplifying an error between a first signal and a second signal and outputting the amplified error as an error signal, and includes a transconductance amplifier, a transistor, and a capacitor. A first input terminal of the transconductance amplifier is electrically connected to a wiring for supplying the first signal. A second input terminal of the transconductance amplifier is electrically connected to a wiring for supplying the second signal. A gate of the transistor is electrically connected to a wiring for supplying a standby signal. One of a source and a drain of the transistor is electrically connected to the transconductance amplifier. One of electrodes of the capacitor is electrically connected to the other of the source and the drain of the transistor. The other electrode of the capacitor is electrically connected to a wiring for supplying a fixed potential. A channel of the transistor is formed in an oxide semiconductor layer. The error signal is a potential of a node to which an output terminal of the transconductance amplifier and the one of the source and the drain of the transistor are electrically connected, or a potential of a node to which the other of the source and the drain of the transistor and the one electrode of the capacitor are electrically connected.

In a semiconductor device according to one embodiment of the present invention, electrical connection between an output terminal of a transconductance amplifier and one electrode of a capacitor can be controlled by a transistor whose channel is formed in an oxide semiconductor layer. Consequently, turning off the transistor allows the one electrode of the capacitor to hold charge for a long time even if the transconductance amplifier is in a standby mode. Moreover, when the transconductance amplifier returns from the standby mode, turning on the transistor makes it possible to settle charging and discharging of the capacitor in a short time. As a result, the operation of the semiconductor device can enter into a steady state in a short time.

BRIEF DESCRIPTION OF THE DRAWINGS

In the accompanying drawings:

FIGS. 3A to 3C each illustrate an example of a structure of an oxide semiconductor;

DETAILED DESCRIPTION OF THE INVENTION

Embodiments of the present invention will be described below in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be limited to the descriptions of the embodiments below.

<Example of Configuration of Semiconductor Device>

Figure 1A:
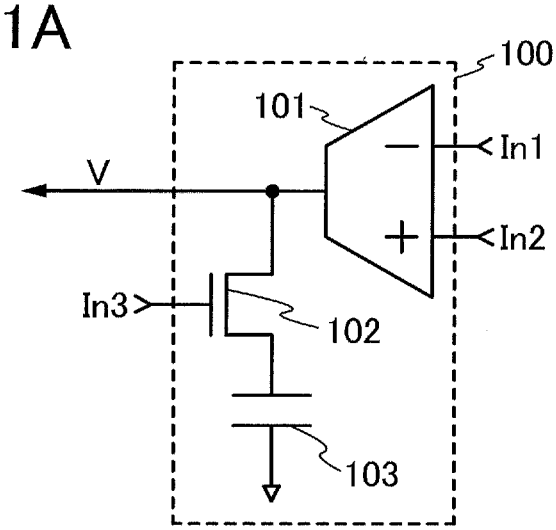
FIGS. 1A and 1B each illustrate an example of a configuration of a semiconductor device.
Figure 1B:
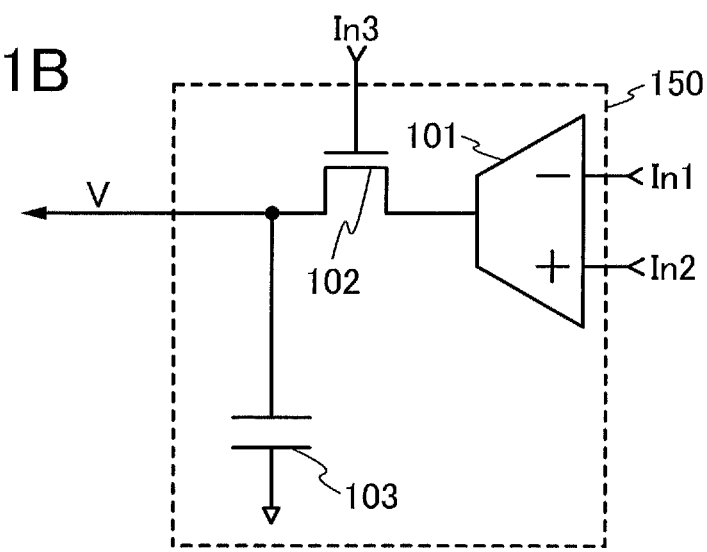

FIGS. 1A and 1B each illustrate an example of the configuration of a semiconductor device according to one embodiment of the present invention. A semiconductor device 100 illustrated in FIG. 1A has a function of amplifying an error between a signal (In1) and a signal (In2) and outputting the amplified error as an error signal (V). Specifically, the semiconductor device 100 includes a transconductance amplifier 101, a transistor 102, and a capacitor 103. An inverting input terminal (−) of the transconductance amplifier 101 is electrically connected to a wiring for supplying the signal (In1). A non-inverting input terminal (+) of the transconductance amplifier 101 is electrically connected to a wiring for supplying the signal (In2). A gate of the transistor 102 is electrically connected to a wiring for supplying a signal (In3). One of a source and a drain of the transistor 102 is electrically connected to an output terminal of the transconductance amplifier 101. One of electrodes of the capacitor 103 is electrically connected to the other of the source and the drain of the transistor 102. The other electrode of the capacitor 103 is electrically connected to a wiring for supplying a fixed potential. Note that the transistor 102 is a transistor whose channel is formed in an oxide semiconductor layer.

In the semiconductor device 100 in FIG. 1A, an output current of the transconductance amplifier 101 is controlled in accordance with the signal (In1) input to the inverting input terminal (−) of the transconductance amplifier 101 and the signal (In2) input to the non-inverting input terminal (+) of the transconductance amplifier 101. When the transistor 102 is on, the capacitor 103 is charged and discharged in accordance with the output current. As a result, the potential of a node to which the output terminal of the transconductance amplifier 101 and the one electrode of the capacitor 103 are electrically connected becomes the error signal (V). Note that switching of the transistor 102 is controlled by the signal (In3) input from an external unit.

Further, in the semiconductor device 100 in FIG. 1A, the transconductance amplifier 101 can be brought into a standby mode.

In the semiconductor device in FIG. 1A, by control of the signal (In3), the transistor 102 can be turned off before the transconductance amplifier 101 is brought into a standby mode and the transistor 102 can be turned on after the transconductance amplifier 101 returns from the standby mode. Consequently, in the semiconductor device in FIG. 1A, loss of charge held in the one electrode of the capacitor 103 can be reduced in a period during which the transconductance amplifier 101 is in the standby mode. Thus, in the semiconductor device in FIG. 1A, charging and discharging of the capacitor 103 caused when the transconductance amplifier 101 returns from the standby mode can be settled in a short time. As a result, the operation of the semiconductor device can enter into a steady state in a short time.

The semiconductor device according to one embodiment of the present invention can have the configuration of a semiconductor device 150 illustrated in FIG. 1B. The semiconductor device 150 in FIG. 1B differs from the semiconductor device 100 in FIG. 1A in the position of the node whose potential is output as the error signal (V). Specifically, in the semiconductor device 100 in FIG. 1A, the potential of the node to which the one of the source and the drain of the transistor 102 and the output terminal of the transconductance amplifier 101 are electrically connected is output as the error signal (V); whereas in the semiconductor device 150 in FIG. 1B, the potential of a node to which the other of the source and the drain of the transistor 102 and the one electrode of the capacitor 103 are electrically connected is output as the error signal (V). The semiconductor device 150 in FIG. 1B is the same as the semiconductor device 100 in FIG. 1A except for the foregoing; therefore, the above description is employed for the detailed description of the semiconductor device 150.

<Oxide Semiconductor>

An oxide semiconductor will be described below in detail.

An oxide semiconductor contains at least one element selected from In, Ga, Sn, and Zn. For example, it is possible to use any of the following oxide semiconductors: an In—Sn—Ga—Zn—O-based oxide semiconductor which is an oxide of four metal elements; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor which are metal oxides of three metal elements; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, and an In—Ga—O-based oxide semiconductor which are metal oxides of two metal elements; and an In—O-based oxide semiconductor, a Sn—O-based oxide semiconductor, and a Zn—O-based oxide semiconductor which are metal oxides of one metal element. In addition, any of the above oxide semiconductors may contain an element other than In, Ga, Sn, and Zn, for example, Si.

Note that an In—Ga—Zn—O-based oxide semiconductor refers to an oxide semiconductor containing indium (In), gallium (Ga), and zinc (Zn), and there is no limitation on the composition ratio thereof.

For an oxide semiconductor layer, a thin film expressed by a chemical formula of $InMO_3(ZnO)_m$ ($m>0$) can be used. Here, M represents one or more metal elements selected from Zn, Ga, Al, Mn, and Co. For example, M can be Ga, Ga and Al, Ga and Mn, or Ga and Co.

In the case where an In—Zn—O-based material is used as the oxide semiconductor, the In—Zn—O-based material has an In to Zn atomic ratio ranging from 0.5 to 50, preferably 1 to 20, further preferably 1.5 to 15. When the atomic ratio of In to Zn is in the above preferred range, the field-effect mobility of the semiconductor element can be increased. Here, when the atomic ratio of the compound is In:Zn:O=X:Y:Z, the relation $Z>1.5X+Y$ is satisfied.

Note that it is preferable that the oxide semiconductor layer be highly purified by a reduction of impurities such as moisture and hydrogen which serve as electron donors (donors). Specifically, the concentration of hydrogen in the highly purified oxide semiconductor layer which is measured by secondary ion mass spectrometry (SIMS) is $5 \times 10^{19}/cm^3$ or lower, preferably $5 \times 10^{18}/cm^3$ or lower, further preferably $5 \times 10^{17}/cm^3$ or lower, still further preferably $1 \times 10^{16}/cm^3$ or lower. The carrier density of the oxide semiconductor layer measured by Hall effect measurement is less than $1 \times 10^{14}/cm^3$, preferably less than $1 \times 10^{12}/cm^3$, further preferably less than $1 \times 10^{11}/cm^3$.

The analysis of the hydrogen concentration in the oxide semiconductor layer is described here. The hydrogen concentration of the semiconductor layer is measured by SIMS. It is known that it is difficult, in principle, to obtain correct data in the proximity of a surface of a sample or in the proximity of an interface between stacked layers formed using different materials by the SIMS analysis. Thus, in the case where the distribution of the concentration of hydrogen in the layer in the thickness direction is analyzed by SIMS, an average value in a region of the layer in which the value is not greatly changed and substantially the same value can be obtained is employed as the hydrogen concentration. Further, in the case where the thickness of the layer is small, a region where almost the same value is obtained cannot be found in some cases due to the influence of the hydrogen concentration of an adjacent layer. In that case, the maximum value or the minimum value of the hydrogen concentration in the region of the layer is employed as the hydrogen concentration of the layer. Moreover, in the case where a mountain-shaped peak having the maximum value or a valley-shaped peak having the minimum value do not exist in the region of the layer, the value at the inflection point is employed as the hydrogen concentration.

When the oxide semiconductor layer is to be formed by sputtering, it is important to reduce water and hydrogen existing in the chamber as much as possible, in addition to the hydrogen concentration of the target. Specifically, for example, it is effective to perform baking of the chamber before deposition of the oxide semiconductor layer, to reduce the concentration of water and hydrogen in a gas introduced into the chamber, and to prevent the counter flow in an evacuation system for exhausting a gas from the chamber.

The oxide semiconductor layer may be amorphous or may have crystallinity. For example, the oxide semiconductor layer can be formed using an oxide semiconductor film including a c-axis aligned crystal (also referred to as CAAC), which is called a CAAC-OS film.

Specifically, the CAAC-OS film has hexagonal crystals containing zinc. The a-b planes of the crystals are substantially parallel to a surface of a film over which the CAAC-OS film is formed. The c-axes of the crystals are substantially perpendicular to the surface of the film over which the CAAC-OS film is formed. In the a-b plane of the crystal, atoms contained in the crystal are bonded to form a hexagonal lattice.

In the CAAC-OS, metal atoms and oxygen atoms are bonded in an orderly manner in comparison with an amorphous oxide semiconductor. In other words, the number of oxygen atoms coordinated to a metal atom might vary between metal atoms in the case where an oxide semiconductor is amorphous, whereas the number of oxygen atoms coordinated to metal atoms is substantially the same in the CAAC-OS. Therefore, microscopic defects of oxygen can be reduced, and instability and moving of charge due to attachment and detachment of hydrogen atoms (including hydrogen ions) or alkali metal atoms can be reduced.

Thus, the use of the CAAC-OS film for the oxide semiconductor layer makes it possible to increase the reliability of a transistor whose channel is formed in the oxide semiconductor layer.

The proportion of oxygen gas in an atmosphere at the time when the CAAC-OS film is deposited by sputtering is preferably high. For sputtering in a mixed gas atmosphere of argon and oxygen, for example, the proportion of oxygen gas is preferably set 30% or higher, more preferably 40% or higher. This is because supply of oxygen from the atmosphere promotes crystallization of the CAAC-OS film.

When the CAAC-OS film is deposited by sputtering, a substrate over which the CAAC-OS film is deposited is heated preferably to 150° C. or higher, further preferably to 170° C. or higher. This is because the higher the substrate temperature, the more the crystallization of the CAAC-OS film is promoted.

After being subjected to heat treatment in a nitrogen atmosphere or in vacuum, the CAAC-OS film is preferably subjected to heat treatment in an oxygen atmosphere or a mixed atmosphere of oxygen and another gas. This is because oxygen vacancies due to the former heat treatment can be compensated by supply of oxygen from the atmosphere in the latter heat treatment.

A film surface on which the CAAC-OS film is deposited (deposition surface) is preferably flat. For that reason, the deposition surface is preferably subjected to planarization treatment such as chemical mechanical polishing (CMP) before the CAAC-OS film is formed. The average roughness of the deposition surface is preferably 0.5 nm or less, further preferably 0.3 nm or less.

Next, a crystal structure of the CAAC-OS film will be described in detail with reference to FIGS. 2A to 2E, FIGS. 3A to 3C, and FIGS. 4A to 4C. In FIGS. 2A to 2E, FIGS. 3A to 3C, and FIGS. 4A to 4C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). In FIGS. 2A to 2E, O surrounded by a circle represents tetracoordinate O and O surrounded by a double circle represents tricoordinate O.

Figure 2A:
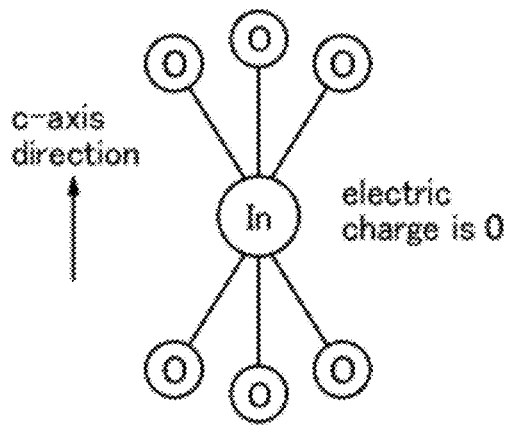
FIGS. 2A to 2E each illustrate an example of a structure of an oxide semiconductor.

FIG. 2A illustrates a structure including one hexacoordinate In atom and six tetracoordinate oxygen (hereinafter referred to as tetracoordinate O) atoms proximate to the In atom. A structure including one In atom and oxygen atoms proximate to the In atom is called a subunit here. The structure in FIG. 2A is an octahedral structure, but is illustrated as a planar structure for simplicity. Note that three tetracoordinate O atoms exist in each of the upper half and the lower half in FIG. 2A. The electric charge of the subunit in FIG. 2A is 0.

Figure 2D:
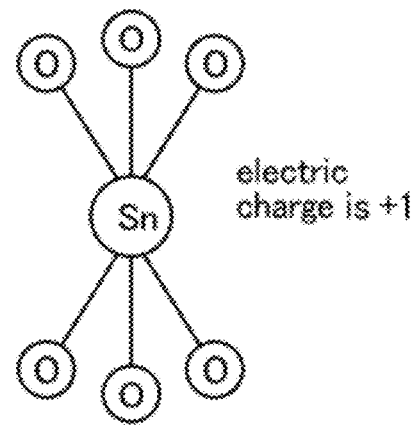
Figure 2B:
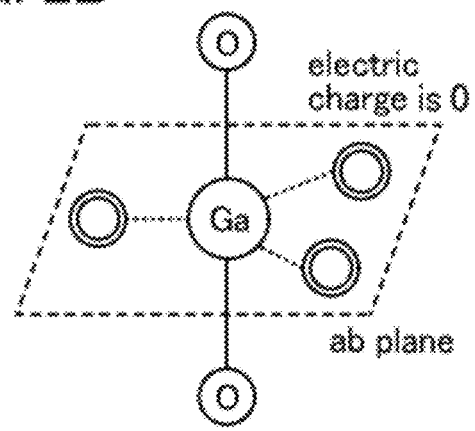

FIG. 2B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of the upper half and the lower half in FIG. 2B. An In atom can also have the structure illustrated in FIG. 2B because the In atom can have five ligands. The electric charge of the subunit in FIG. 2B is 0.

Figure 2E:
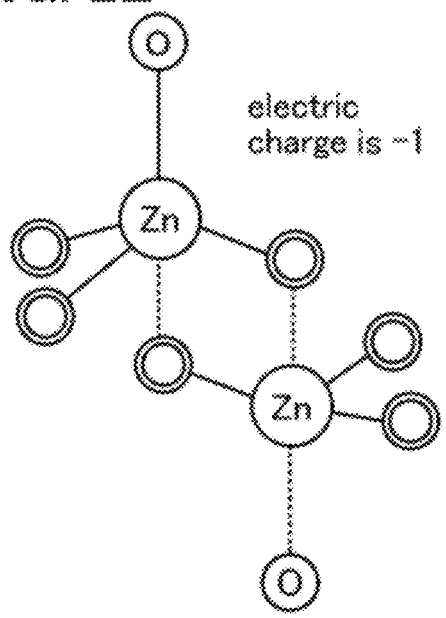
Figure 2C:
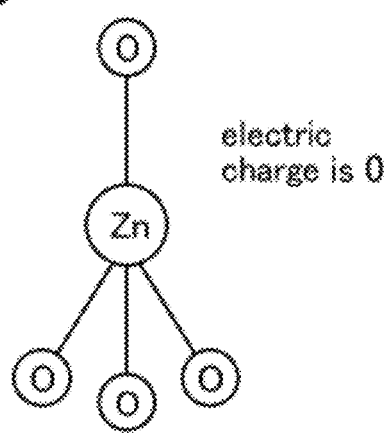

FIG. 2C illustrates a structure including one tetracoordinate Zn atom and four tetracoordinate O atoms proximate to the Zn atom. In FIG. 2C, one tetracoordinate O atom exists in the upper half and three tetracoordinate O atoms exist in the lower half. The electric charge of the subunit in FIG. 2C is 0.

FIG. 2D illustrates a structure including one hexacoordinate Sn atom and six tetracoordinate O atoms proximate to the Sn atom. In FIG. 2D, three tetracoordinate O atoms exist in each of the upper half and the lower half. The electric charge of the subunit in FIG. 2D is +1.

FIG. 2E illustrates a subunit including two Zn atoms. In FIG. 2E, one tetracoordinate O atom exists in each of the upper half and the lower half. The electric charge of the subunit in FIG. 2E is −1.

Here, an assembly of several subunits is referred to as one group, and an assembly of several groups is referred to as one unit.

Now, a rule of bonding between the subunits will be described. The three O atoms in the upper half with respect to the hexacoordinate In atom each have three proximate In atoms in the downward direction, and the three O atoms in the lower half each have three proximate In atoms in the upward direction. The one O atom in the upper half with respect to the Ga atom has one proximate Ga atom in the downward direction, and the one O atom in the lower half has one proximate Ga atom in the upward direction. The one O atom in the upper half with respect to the Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of subunits including the metal atoms can be bonded. For example, in the case where the hexacoordinate metal (In or Sn) atom is bonded through three tetracoordinate O atoms in the upper half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition, subunits are bonded to each other so that the total electric charge of the layered structure is 0, thereby forming one group.

FIG. 3A illustrates a model of one group included in a layered structure of an In—Sn—Zn—O-based material. FIG. 3B illustrates a unit including three groups. FIG. 3C illustrates an atomic arrangement where the layered structure in FIG. 3B is observed from the c-axis direction.

In FIG. 3A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 3A, one tetracoordinate O atom existing in each of an upper half and a lower half with respect to an In atom is denoted by circled 1. FIG. 3A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the group included in the layered structure of the In—Sn—Zn—O-based material in FIG. 3A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a subunit that includes two Zn atoms and is proximate to one tetracoordinate O atom in an upper half, and the subunit is bonded to a Sn atom proximate to three tetracoordinate O atoms in each of an upper half and a lower half through one tetracoordinate O atom in a lower half with respect to the subunit. A plurality of such groups are bonded to form the unit.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a subunit including a Sn atom is +1. Therefore, electric charge of −1, which cancels +1, is needed to form a layered structure including a Sn atom. As a structure having electric charge of −1, the subunit including two Zn atoms as illustrated in FIG. 2E can be given. For example, with one subunit including two Zn atoms, electric charge of one subunit including a Sn atom can be cancelled, so that the total electric charge of the layered structure can result in 0.

An In atom can have either five ligands or six ligands. Specifically, In—Sn—Zn—O-based crystal ($In_2SnZn_3O_8$) can be formed with the unit illustrated in FIG. 3B. Note that a layered structure of the obtained In—Sn—Zn—O-based crystal can be expressed as a composition formula, $In_2SnZn_2O_7(ZnO)_m$ (m is 0 or a natural number). The variable m is preferably large because the larger the variable m, the higher the crystallinity of the In—Sn—Zn—O-based crystal.

The same applies to the case of using any of the following oxides, for example: an oxide of four metal elements, such as an In—Sn—Ga—Zn—O-based oxide; an oxide of three metal elements, such as an In—Ga—Zn—O-based oxide (IGZO), an In—Al—Zn—O-based oxide, a Sn—Ga—Zn—O-based oxide, an Al—Ga—Zn—O-based oxide, and a Sn—Al—Zn—O-based oxide; an oxide of two metal elements, such as an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, and an In—Ga—O-based oxide; and an oxide of one metal element, such as an In—O-based oxide, a Sn—O-based oxide, and a Zn—O-based oxide.

Figure 4A:
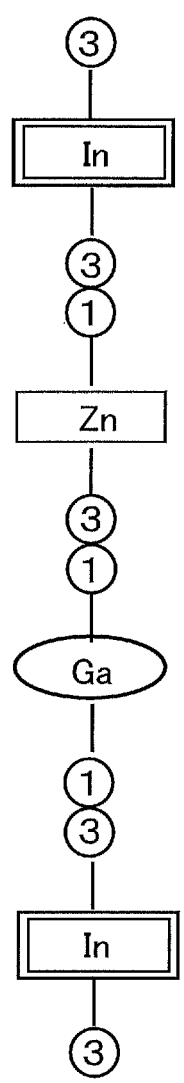
FIGS. 4A to 4C each illustrate an example of a structure of an oxide semiconductor.

As an example, FIG. 4A illustrates a model of one group included in a layered structure of an In—Ga—Zn—O-based material.

In the group included in the layered structure of the In—Ga—Zn—O-based material in FIG. 4A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such groups are bonded to form a unit.

Figure 4B:
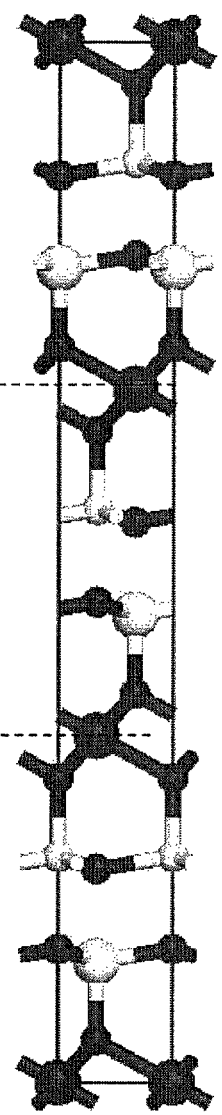
Figure 4C:
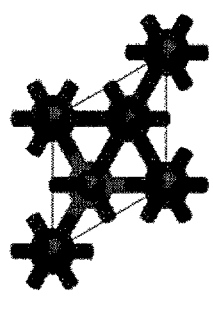
Figure 4C:
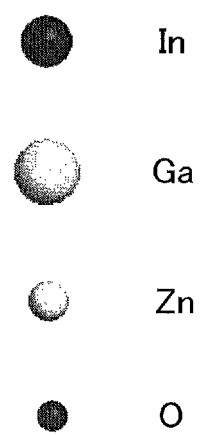

FIG. 4B illustrates a unit including three groups. FIG. 4C illustrates an atomic arrangement where the layered structure in FIG. 4B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a subunit including any of an In atom, a Zn atom, and a Ga atom is 0. As a result, the total electric charge of a group having a combination of these subunits is always 0.

In order to form the layered structure of the In—Ga—Zn—O-based material, a unit can be formed using not only the group illustrated in FIG. 4A but also a unit in which the arrangement of the In atom, the Ga atom, and the Zn atom is different from that in FIG. 4A.

<Transistor Whose Channel is Formed in Oxide Semiconductor Layer>

A transistor whose channel is formed in an oxide semiconductor layer will be described with reference to FIGS. 5A to 5D. FIGS. 5A to 5D are schematic cross-sectional views each illustrating an example of the structure of the transistor.

Figure 5A:
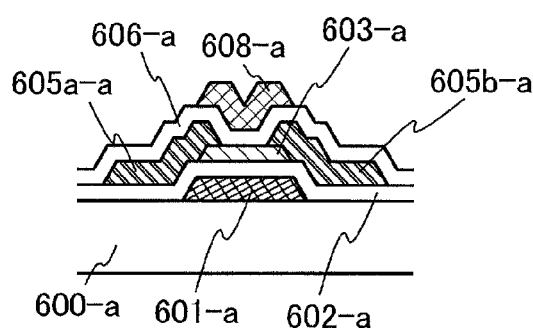
FIGS. 5A to 5D each illustrate an example of a structure of a transistor.

The transistor illustrated in FIG. 5A includes a conductive layer 601-*a*, an insulating layer 602-*a*, an oxide semiconductor layer 603-*a*, a conductive layer 605*a*-*a*, a conductive layer 605*b*-*a*, an insulating layer 606-*a*, and a conductive layer 608-*a*.

The conductive layer 601-*a* is provided over an element formation layer 600-*a*.

The insulating layer 602-*a* is provided over the conductive layer 601-*a*.

The oxide semiconductor layer 603-*a* overlaps the conductive layer 601-*a* with the insulating layer 602-*a* placed therebetween.

The conductive layers 605*a*-*a* and 605*b*-*a* are provided over the oxide semiconductor layer 603-*a* and electrically connected to the oxide semiconductor layer 603-*a*.

The insulating layer 606-*a* is provided over the oxide semiconductor layer 603-*a*, the conductive layer 605*a*-*a*, and the conductive layer 605*b*-*a*.

The conductive layer 608-*a* overlaps the oxide semiconductor layer 603-*a* with the insulating layer 606-*a* placed therebetween.

Note that one of the conductive layers 601-*a* and 608-*a* is not necessarily provided. In the case where the conductive layer 608-*a* is not provided, the insulating layer 606-*a* is not necessarily provided.

Figure 5B:
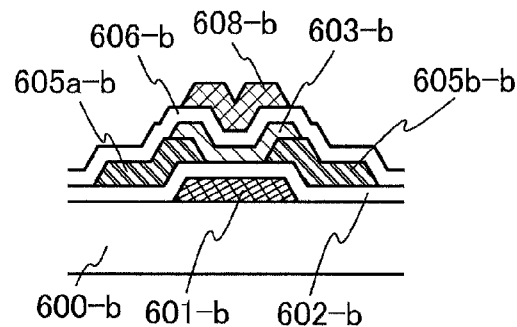

The transistor illustrated in FIG. 5B includes a conductive layer 601-*b*, an insulating layer 602-*b*, an oxide semiconductor layer 603-*b*, a conductive layer 605*a*-*b*, a conductive layer 605*b*-*b*, an insulating layer 606-*b*, and a conductive layer 608-*b*.

The conductive layer 601-*b* is provided over an element formation layer 600-*b*.

The insulating layer 602-*b* is provided over the conductive layer 601-*b*.

The conductive layers 605*a*-*b* and 605*b*-*b* are each provided over part of the insulating layer 602-*b*.

The oxide semiconductor layer 603-*b* is provided over the conductive layers 605*a*-*b* and 605*b*-*b* and electrically connected to the conductive layers 605*a*-*b* and 605*b*-*b*. The oxide semiconductor layer 603-*b* overlaps the conductive layer 601-*b* with the insulating layer 602-*b* placed therebetween.

The insulating layer 606-*b* is provided over the oxide semiconductor layer 603-*b*, the conductive layer 605*a*-*b*, and the conductive layer 605*b*-*b*.

The conductive layer 608-*b* overlaps the oxide semiconductor layer 603-*b* with the insulating layer 606-*b* placed therebetween.

Note that one of the conductive layers 601-*b* and 608-*b* is not necessarily provided. In the case where the conductive layer 608-*b* is not provided, the insulating layer 606-*b* is not necessarily provided.

Figure 5C:
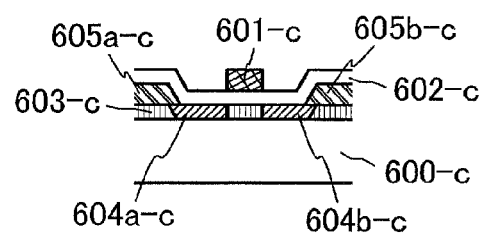

The transistor illustrated in FIG. 5C includes a conductive layer 601-*c*, an insulating layer 602-*c*, an oxide semiconductor layer 603-*c*, a conductive layer 605*a*-*c*, and a conductive layer 605*b*-*c*.

The oxide semiconductor layer 603-*c* includes a region 604*a*-*c* and a region 604*b*-*c*. The region 604*a*-*c* and the region 604*b*-*c* are positioned apart from each other, and are regions to which a dopant is added. A region between the region 604*a*-*c* and the region 604*b*-*c* serves as a channel formation region. The oxide semiconductor layer 603-*c* is provided over an element formation layer 600-*c*. Note that it is not necessary to provide the region 604*a*-*c* and the region 604*b*-*c*.

The conductive layers 605*a*-*c* and 605*b*-*c* are provided over the oxide semiconductor layer 603-*c* and electrically connected to the oxide semiconductor layer 603-*c*. Side surfaces of the conductive layers 605*a*-*c* and 605*b*-*c* are tapered.

The conductive layer 605*a*-*c* overlaps part of the region 604*a*-*c*; however, the present invention is not necessarily limited to this structure. When the conductive layer 605*a*-*c* overlaps part of the region 604*a*-*c*, the resistance between the conductive layer 605*a*-*c* and the region 604*a*-*c* can be low. Alternatively, a region of the oxide semiconductor layer 603-*c* which overlaps with the conductive layer 605*a*-*c* may be all the region 604*a*-*c*.

The conductive layer 605*b*-*c* overlaps part of the region 604*b*-*c*; however, the present invention is not limited to this structure. When the conductive layer 605*b*-*c* overlaps part of the region 604*b*-*c*, the resistance between the conductive layer 605*b*-*c* and the region 604*b*-*c* can be low. Alternatively, a region of the oxide semiconductor layer 603-*c* which overlaps with the conductive layer 605*b*-*c* may be all the region 604*b*-*c*.

The insulating layer 602-*c* is provided over the oxide semiconductor layer 603-*c*, the conductive layer 605*a*-*c*, and the conductive layer 605*b*-*c*.

The conductive layer 601-*c* overlaps the oxide semiconductor layer 603-*c* with the insulating layer 602-*c* placed therebetween. In the oxide semiconductor layer 603-*c*, a region that overlaps with the conductive layer 601-*c* with the insulating layer 602-*c* placed therebetween serves as a channel formation region.

Figure 5D:
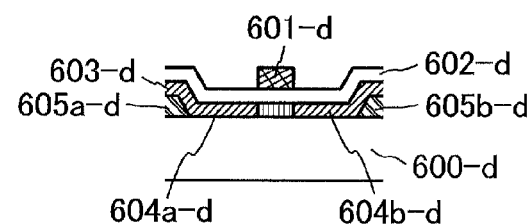

The transistor illustrated in FIG. 5D includes a conductive layer 601-*d*, an insulating layer 602-*d*, an oxide semiconductor layer 603-*d*, a conductive layer 605*a*-*d*, and a conductive layer 605*b*-*d*.

The conductive layers 605*a*-*d* and 605*b*-*d* are provided over an element formation layer 600-*d*. Side surfaces of the conductive layers 605*a*-*d* and 605*b*-*d* are tapered.

The oxide semiconductor layer 603-*d* includes a region 604*a*-*d* and a region 604*b*-*d*. The region 604*a*-*d* and the region 604*b*-*d* are positioned apart from each other, and are regions to which a dopant is added. A region between the region 604*a*-*d* and the region 604*b*-*d* serves as a channel formation region. The oxide semiconductor layer 603-*d* is provided over the conductive layers 605*a*-*d* and 605*b*-*d* and the element formation layer 600-*d*, for example, and electrically connected to the conductive layers 605*a*-*d* and 605*b*-*d*. Note that it is not necessary to provide the region 604*a*-*d* and the region 604*b*-*d*.

The region 604*a*-*d* is electrically connected to the conductive layer 605*a*-*d*.

The region 604*b*-*d* is electrically connected to the conductive layer 605*b*-*d*.

The insulating layer 602-*d* is provided over the oxide semiconductor layer 603-*d*.

The conductive layer 601-*d* overlaps the oxide semiconductor layer 603-*d* with the insulating layer 602-*d* placed therebetween. In the oxide semiconductor layer 603-*d*, a region that overlaps with the conductive layer 601-*d* with the insulating layer 602-*d* placed therebetween serves as a channel formation region.

Further, the components illustrated in FIGS. 5A to 5D will be described.

As each of the element formation layers 600-*a* to 600-*d*, an insulating layer or a substrate having an insulating surface can be used, for example. Moreover, a layer over which elements are formed in advance can be used as the element formation layers 600-*a* to 600-*d*.

The conductive layers 601-*a* to 601-*d* each function as a gate of the transistor. Note that a layer functioning as a gate of the transistor can be called a gate electrode or a gate wiring.

As the conductive layers 601-*a* to 601-*d*, it is possible to use, for example, a layer of a metal material such as molybdenum, magnesium, titanium, chromium, tantalum, tungsten, aluminum, copper, neodymium, or scandium or an alloy material containing any of these materials as a main component. Alternatively, each of the conductive layers 601-*a* to 601-*d* can be a stack of layers of materials applicable to the conductive layers 601-*a* to 601-*d*.

Each of the insulating layers 602-*a* to 602-*d* functions as a gate insulating layer of the transistor.

Each of the insulating layers 602-*a* to 602-*d* can be, for example, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, a hafnium oxide layer, or a lanthanum oxide layer.

In addition, as the insulating layers 602-*a* to 602-*d*, an insulating layer of a material containing, for example, an element that belongs to Group 13 in the periodic table and oxygen can be used. For example, when the oxide semiconductor layers 603-*a* to 603-*d* contain a Group 13 element, the use of insulating layers containing a Group 13 element as insulating layers in contact with the oxide semiconductor layers 603-*a* to 603-*d* makes the state of the interfaces between the insulating layers and the oxide semiconductor layers favorable.

Examples of the material containing a Group 13 element and oxygen are gallium oxide, aluminum oxide, aluminum gallium oxide, and gallium aluminum oxide. Note that aluminum gallium oxide refers to a substance in which the amount of aluminum is larger than that of gallium in atomic percent, and gallium aluminum oxide refers to a substance in which the amount of gallium is larger than or equal to that of aluminum in atomic percent. For example, it is possible to use a material represented by $Al_2O_x$ (x=3+α, where α is larger than 0 and smaller than 1), $Ga_2O_x$ (x=3+α, where α is larger than 0 and smaller than 1), or $Ga_xAl_{2-x}O_{3+\alpha}$ (x is larger than 0 and smaller than 2 and α is larger than 0 and smaller than 1).

Moreover, the insulating layers 602-*a* to 602-*d* can be formed by stacking layers of materials applicable to the insulating layers 602-*a* to 602-*d*. For example, the insulating layers 602-*a* to 602-*d* can be a stack of layers containing gallium oxide represented by $Ga_2O_x$. Alternatively, the insulating layers 602-*a* to 602-*d* can be a stack of an insulating layer containing gallium oxide represented by $Ga_2O_x$ and an insulating layer containing aluminum oxide represented by $Al_2O_x$.

When the channel length of the transistor is 30 nm, the oxide semiconductor layers 603-*a* to 603-*d* may have a thickness of about 5 nm, for example. In that case, a short-channel effect can be prevented in the transistor when each of the oxide semiconductor layers 603-*a* to 603-*d* is formed using a CAAC-OS film.

A dopant imparting n-type or p-type conductivity is added to the regions 604*a*-*c*, 604*b*-*c*, 604*a*-*d*, and 604*b*-*d*, each of which functions as a source or a drain of the transistor. As the dopant, it is possible to use, for example, one or more elements of Group 13 in the periodic table (e.g., boron), of Group 15 in the periodic table (e.g., one or more of nitrogen, phosphorus, and arsenic), and of rare gas (e.g., one or more of helium, argon, and xenon). Note that a region functioning as a source of the transistor can be called a source region, and a region functioning as a drain of the transistor can be called a drain region. The addition of the dopant to the regions 604*a*-*c*, 604*b*-*c*, 604*a*-*d*, and 604*b*-*d* reduces the connection resistance between the regions 604*a*-*c*, 604*b*-*c*, 604*a*-*d*, and 604*b*-*d* and the conductive layers; accordingly, the transistors can be downsized.

The conductive layers 605*a*-*a* to 605*a*-*d* and the conductive layers 605*b*-*a* to 605*b*-*d* each function as the source or the drain of the transistor. Note that a layer functioning as a source of the transistor can be called a source electrode or a source wiring, and a layer functioning as a drain of the transistor can be called a drain electrode or a drain wiring.

Each of the conductive layers 605*a*-*a* to 605*a*-*d* and the conductive layers 605*b*-*a* to 605*b*-*d* can be formed using, for example, a layer of a metal material such as aluminum, magnesium, chromium, copper, tantalum, titanium, molybdenum, or tungsten or an alloy material containing any of the above metal materials as its main component. For example, each of the conductive layers 605*a*-*a* to 605*a*-*d* and the conductive layers 605*b*-*a* to 605*b*-*d* can be formed using a layer of an alloy material containing copper, magnesium, and aluminum. Alternatively, each of the conductive layers 605*a*-*a* to 605*a*-*d* and the conductive layers 605*b*-*a* to 605*b*-*d* can be formed using a stack of layers of materials applicable to the conductive layers 605*a*-*a* to 605*a*-*d* and the conductive layers 605*b*-*a* to 605*b*-*d*. For example, each of the conductive layers 605*a*-*a* to 605*a*-*d* and the conductive layers 605*b*-*a* to 605*b*-*d* can be formed using a stack of a layer of an alloy material containing copper, magnesium, and aluminum and a layer containing copper.

Alternatively, each of the conductive layers 605*a*-*a* to 605*a*-*d* and the conductive layers 605*b*-*a* to 605*b*-*d* can be a layer containing a conductive metal oxide. Examples of the conductive metal oxide are indium oxide, tin oxide, zinc oxide, indium oxide-tin oxide, and indium oxide-zinc oxide. Note that silicon oxide may be contained in the conductive metal oxide applicable to the conductive layers 605*a*-*a* to 605*a*-*d* and the conductive layers 605*b*-*a* and 605*b*-*d*.

Each of the insulating layers 606-*a* and 606-*b* can be a layer of a material applicable to the insulating layers 602-*a* to 602-*d*. Alternatively, each of the insulating layers 606-*a* and 606-*b* may be formed using a stack of layers of materials applicable to the insulating layers 606-*a* and 606-*b*. For example, each of the insulating layers 606-*a* and 606-*b* may be a silicon oxide layer, an aluminum oxide layer, or the like. For example, the use of an aluminum oxide layer as the insulating layers 606-*a* and 606-*b* can more effectively prevent impurities (water) from entering the oxide semiconductor layers 603-*a* and 603-*b* and effectively prevent the oxide semiconductor layers 603-*a* and 603-*b* from releasing oxygen.

The conductive layers 608-*a* and 608-*b* each function as a gate of the transistor. Note that in the case where the transistor includes both the conductive layers 601-*a* and 608-*a* or both the conductive layers 601-*b* and 608-*b*, one of the conductive layers 601-*a* and 608-*a* or one of the conductive layers 601-*b* and 608-*b* is referred to as a back gate, a back gate electrode, or a back gate wiring. When a plurality of conductive layers each functioning as a gate are provided with the channel formation layer positioned therebetween, the threshold voltage of the transistor can be easily controlled.

Each of the conductive layers 608-a and 608-b can be a layer of a material applicable to the conductive layers 601-a to 601-d, for example. Alternatively, each of the conductive layers 608-a and 608-b may be formed using a stack of layers of materials applicable to the conductive layers 608-a and 608-b.

Further, an insulating layer functioning as a channel protective layer may be formed by stacking layers of materials applicable to the insulating layers 602-a to 602-d.

In addition, base layers may be formed over the element formation layers 600-a to 600-d and the transistors may be formed over the base layers. The base layer can be a layer of a material applicable to the insulating layers 602-a to 602-d, for example. Alternatively, the base layer may be a stack of layers of materials applicable to the insulating layers 602-a to 602-d. For example, when the base layer is a stack of an aluminum oxide layer and a silicon oxide layer, oxygen included in the base layer can be prevented from being released through the oxide semiconductor layers 603-a to 603-d.

When the insulating layer in contact with each of the oxide semiconductor layers 603-a to 603-d contains an excessive amount of oxygen, oxygen is easily supplied to the oxide semiconductor layers 603-a to 603-d. Thus, oxygen defects in the oxide semiconductor layers 603-a to 603-d and at the interface between the insulating layer and each of the oxide semiconductor layers 603-a to 603-d can be reduced, which leads to further reduction in the carrier concentrations of the oxide semiconductor layers 603-a to 603-d. The present invention is not limited to the above; even if an excessive amount of oxygen is contained in the oxide semiconductor layers 603-a to 603-d through the fabrication process, the insulating layers in contact with the oxide semiconductor layers 603-a to 603-d can prevent oxygen from being released from the oxide semiconductor layers 603-a to 603-d.

Figure 6:
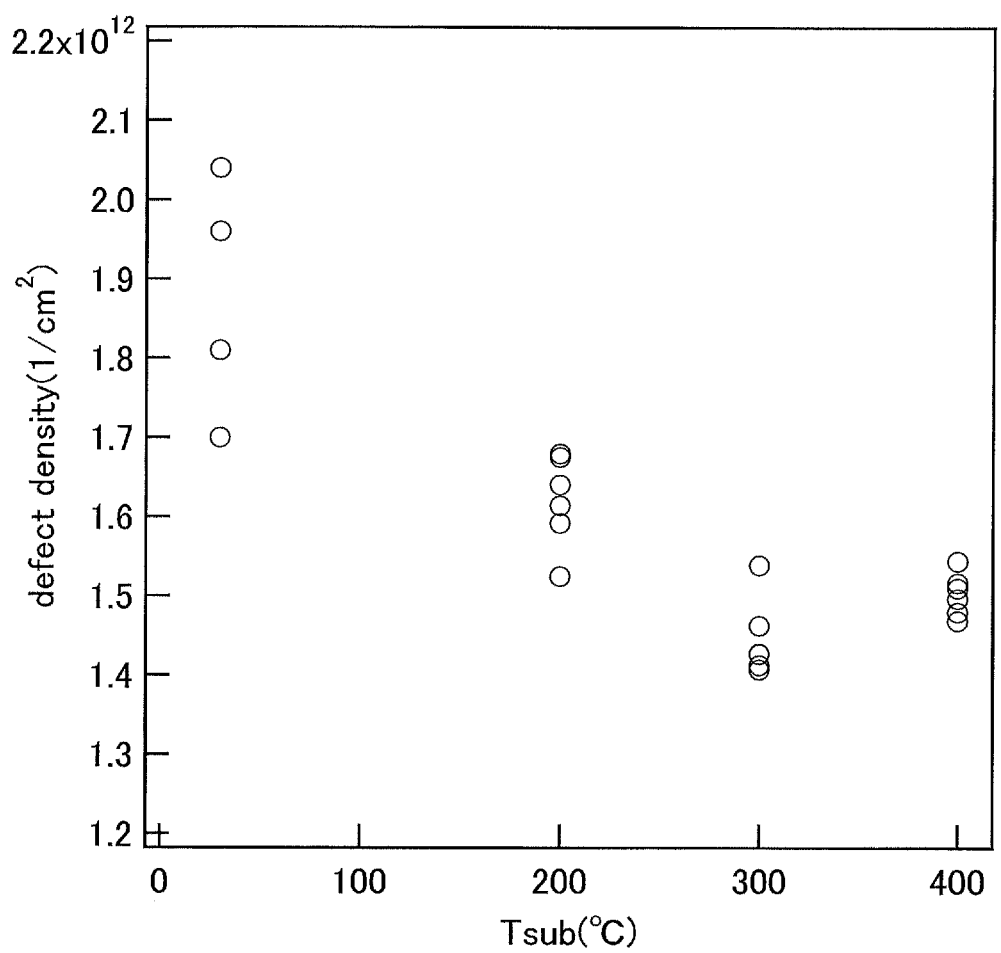
FIG. 6 is a graph showing the relation between defect density and substrate temperature during the deposition of an oxide semiconductor.
Figure 7:
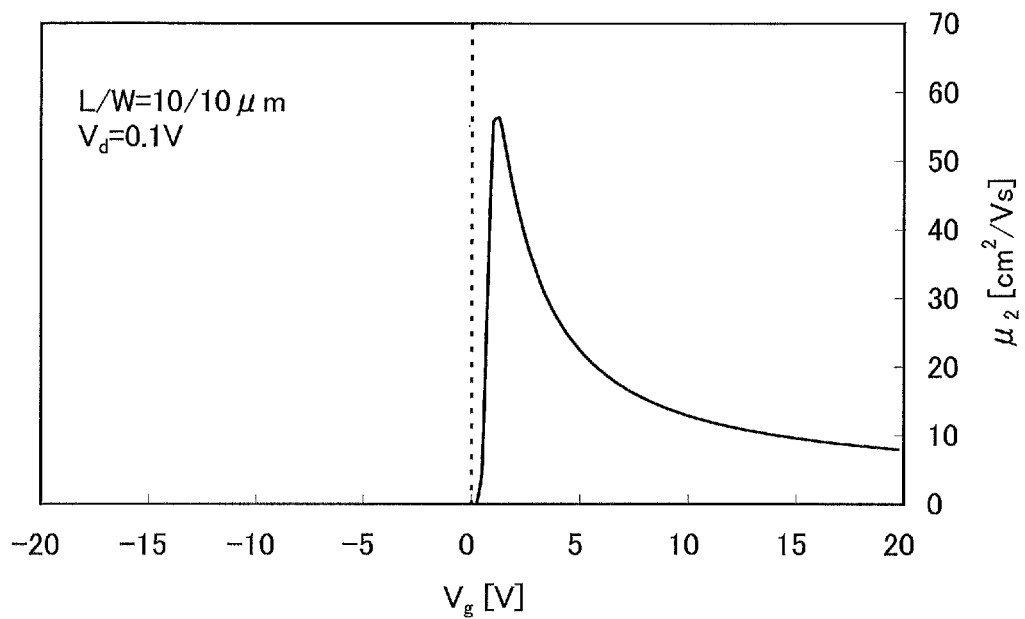
FIG. 7 is a graph showing a calculation result of the mobility of an ideal transistor.

Next, a description is given with reference to FIG. 6 and FIG. 7 of theoretical field-effect mobility of a transistor whose channel is formed in an oxide semiconductor layer. Here, with a Levinson model, the field-effect mobility based on the assumption that no defect exists inside the semiconductor is theoretically calculated. The actually measured field-effect mobility of an insulated gate transistor is lower than its inherent mobility because of a variety of reasons, which occurs not only in the case of using an oxide semiconductor. One of causes for reduction in the mobility is a defect inside a semiconductor or a defect at an interface between the semiconductor and an insulating film.

Assuming that the original mobility and the measured field-effect mobility of a semiconductor are $\mu_0$ and $\mu$, respectively, and a potential barrier (such as a grain boundary) exists in the semiconductor, the measured field-effect mobility $\mu$ can be expressed as the following formula.

$$\mu = \mu_0 \exp\left(-\frac{E}{kT}\right) \quad \text{[Formula 1]}$$

In the formula, E denotes the height of the potential barrier, k denotes the Boltzmann constant, and T denotes the absolute temperature.

When the potential barrier is assumed to be attributed to a defect, the height of the potential barrier can be expressed as the following formula according to the Levinson model.

$$E = \frac{e^2 N^2}{8\varepsilon n} = \frac{e^3 N^2 t}{8\varepsilon C_{ox} V_g} \quad \text{[Formula 2]}$$

Here, e represents the elementary charge, N represents the average defect density per unit area in a channel, ε represents the permittivity of the semiconductor, n represents the carrier density per unit area in the channel, $C_{ox}$ represents the capacitance per unit area, $V_g$ represents the gate voltage, and t represents the thickness of the channel. In the case where the thickness of the oxide semiconductor layer is 30 nm or less, the thickness of the channel can be regarded as being the same as the thickness of the oxide semiconductor layer.

The drain current $I_d$ in a linear region can be expressed as the following formula.

$$I_d = \frac{W \mu V_g V_d C_{ox}}{L} \exp\left(-\frac{E}{kT}\right) \quad \text{[Formula 3]}$$

Here, L represents the channel length and W represents the channel width, and L and W are each 10 μm in this example. In addition, $V_d$ represents the drain voltage.

Further, both sides of Formula 3 are divided by $V_g$ and then logarithms of both the sides are taken, resulting in the following formula.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT\varepsilon C_{ox} V_g} \quad \text{[Formula 4]}$$

The right side of Formula 4 is a function of $V_g$. From Formula 5, it is found that the defect density N can be obtained from the slope of a line taken with $\ln(I_d/V_g)$ as the ordinate and $1/V_g$ as the abscissa. That is, the defect density can be evaluated from the $I_d$-$V_g$ characteristics of the transistor.

The defect density depends on the substrate temperature during the deposition of an oxide semiconductor. FIG. 6 shows the relation between the defect density and the substrate heating temperature. As the oxide semiconductor, an oxide semiconductor containing indium (In), tin (Sn), and zinc (Zn) in a 1:1:1 atomic ratio was used. It is found from FIG. 6 that the oxide semiconductor deposited at higher substrate heating temperatures has lower defect density than the oxide semiconductor deposited at room temperature.

On the basis of the defect density obtained in this manner, or the like, $\mu_0$ can be calculated to be 80 cm²/Vs from Formula 1 and Formula 2. Although the mobility of an oxide semiconductor having many defects (N is about $1.5 \times 10^{12}$/cm²) is about 10 cm²/Vs, the mobility of an ideal oxide semiconductor, which has no defect therein and at the interface with an insulating film, is 80 cm²/Vs.

Note that even if no defect exists inside the oxide semiconductor layer, scattering at an interface between a channel and a gate insulating layer affects the transport property of the transistor. In other words, the mobility $\mu_1$ at a position that is a distance x away from the interface between the channel and the gate insulating layer is expressed by the following formula.

$$\frac{1}{\mu_1} = \frac{1}{\mu_0} + \frac{D}{B}\exp\left(-\frac{x}{l}\right)$$ [Formula 5]

Here, D represents the electric field in the gate direction, and B and/are constants. The values of B and/can be obtained from actual measurement results; according to the above measurement results, B is 2.38×10$^7$ cm/s and/is 10 nm (the depth to which the influence of interface scattering reaches). As D increases (i.e., as the gate voltage increases), the second term of Formula 5 is increased and accordingly the mobility $\mu_1$ is decreased.

FIG. 7 shows calculation results of the mobility $\mu_2$ of an ideal transistor that has no defect in its oxide semiconductor layer. For the calculation, device simulation software Sentaurus Device manufactured by Synopsys, Inc. was used; the band gap, the electron affinity, the relative permittivity, and the thickness of the oxide semiconductor were assumed to be 3.15 eV, 4.6 eV, 15, and 30 nm, respectively. Further, the work functions of a gate, a source, and a drain were assumed to be 5.5 eV, 4.6 eV, and 4.6 eV, respectively. The thickness of a gate insulating layer was assumed to be 30 nm, and the relative permittivity thereof was assumed to be 4.1. The channel length and the channel width were each assumed to be 10 μm, and the drain voltage $V_d$ was assumed to be 0.1 V.

It is found, as shown in FIG. 7, that the mobility has a peak of more than 50 cm$^2$/Vs at a gate voltage that is a little over 1 V and is decreased as the gate voltage becomes higher because the influence of interface scattering is increased.

<Specific Example of Semiconductor Device>

Figure 8A:
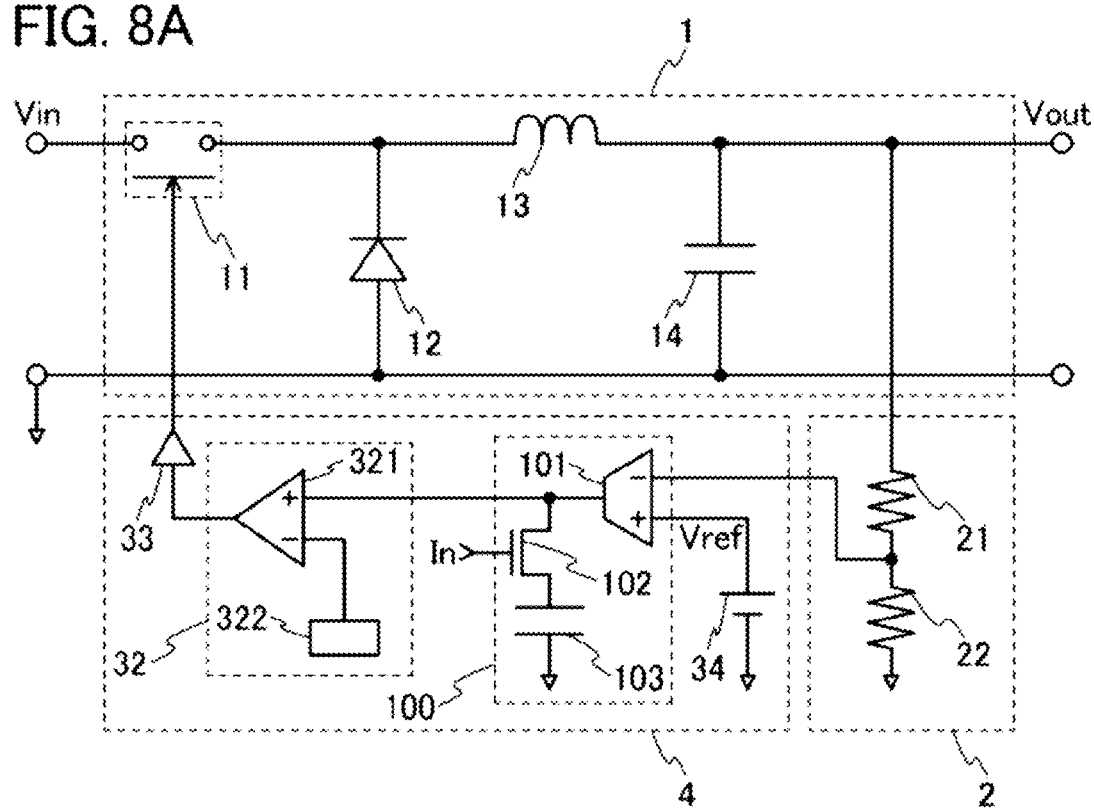
FIGS. 8A and 8B each illustrate a specific example of a DC-DC converter.
Figure 8B:
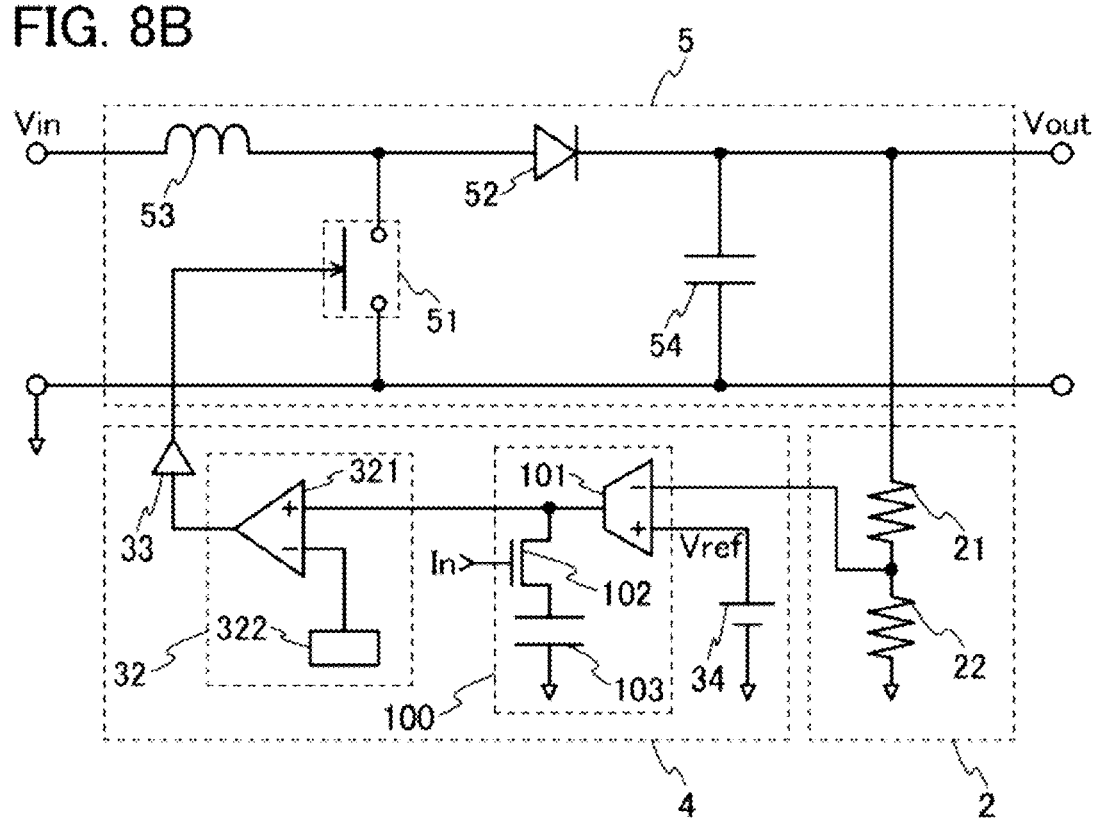

FIGS. 8A and 8B each illustrate a specific example of a semiconductor device according to one embodiment of the present invention. Specifically, the semiconductor devices illustrated in FIGS. 8A and 8B are each a DC-DC converter controlled by a pulse width modulation method.

Figure 10:
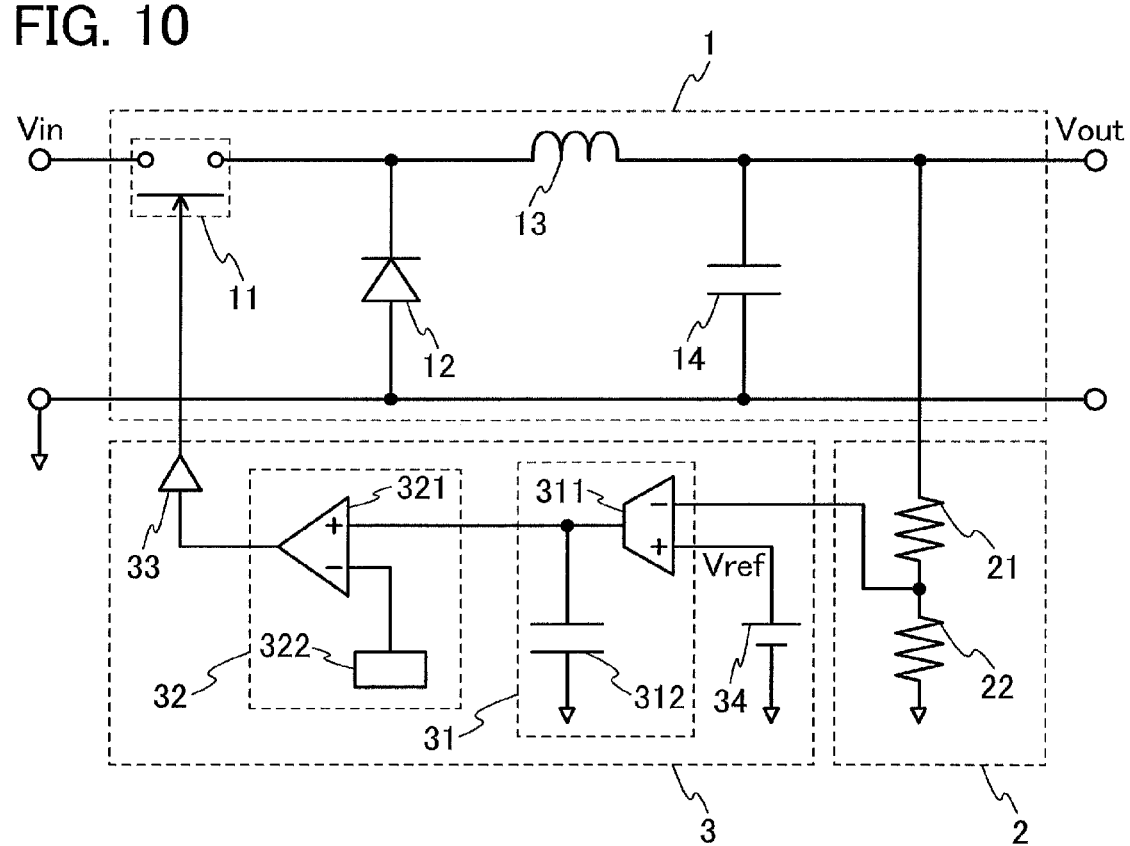
FIG. 10 illustrates an example of a configuration of a DC-DC converter.

The DC-DC converter illustrated in FIG. 8A includes the power conversion unit 1, the output detection unit 2, and a control circuit unit 4. Note that the power conversion unit 1 and the output detection unit 2 have similar configurations to the power conversion unit 1 and the output detection unit 2 included in the DC-DC converter described in FIG. 10; see the above description for the details.

The control circuit unit 4 includes the semiconductor device 100, the pulse width modulator 32, the switch driving circuit 33, and the reference voltage generator 34. Note that the semiconductor device 100, the pulse width modulator 32, the switch driving circuit 33, and the reference voltage generator 34 have similar configurations to the semiconductor device 100 described in FIG. 1A and the pulse width modulator 32, the switch driving circuit 33, and the reference voltage generator 34 described in FIG. 10; see the above description for the details.

An inverting input terminal (−) of the transconductance amplifier 101 is electrically connected to the other end of the resistor 21 and one end of the resistor 22. A non-inverting input terminal (+) of the transconductance amplifier 101 is electrically connected to a wiring for supplying the reference voltage (Vref). An output terminal of the transconductance amplifier 101 and one of a source and a drain of the transistor 102 are electrically connected to a non-inverting input terminal (+) of the comparator 321.

The DC-DC converter in FIG. 8A is a DC-DC converter controlled by feedback control with a pulse width modulation method (i.e., a step-down DC-DC converter controlled by a pulse width modulation method). Since the DC-DC converter in FIG. 8A includes the semiconductor device 100 illustrated in FIG. 1A, the direct-current voltage (Vout) can be fixed in the DC-DC converter soon after the transconductance amplifier 101 or the like returns from the standby mode.

As the switch 11 included in the DC-DC converter in FIG. 8A, a transistor whose channel is formed in an oxide semiconductor layer is preferably used. This is because a current generated while the transistor is off can be reduced, and because the transistor and the transistor 102 in FIG. 8A can be fabricated through the same process (i.e., the number of fabrication steps can be reduced).

Note that FIG. 8A illustrates a specific example of the DC-DC converter including the semiconductor device 100 in FIG. 1A; the semiconductor device 100 can be replaced with the semiconductor device 150 illustrated in FIG. 1B.

Although a specific example of the step-down DC-DC converter is shown in FIG. 8A, the semiconductor device according to one embodiment of the present invention is not limited to a step-down (buck) DC-DC converter. For example, the semiconductor device can be a step-up (boost) converter, a step up/down converter, an inverting converter, a Cuk converter, a SEPIC, or a flyback converter.

As an example, FIG. 8B illustrates a specific example of a step-up DC-DC converter.

The DC-DC converter illustrated in FIG. 8B includes a power conversion unit 5, the output detection unit 2, and the control circuit unit 4. Note that the output detection unit 2 and the control circuit unit 4 have similar configurations to the output detection unit 2 included in the DC-DC converter described in FIG. 10 and the control circuit unit 4 described in FIG. 8A; see the above description for the details.

The power conversion unit 5 includes a switch 51, a diode 52, an inductor 53, and a capacitor 54. One end of the inductor 53 is electrically connected to a terminal to which the direct-current voltage (Vin) is input. One terminal of the switch 51 is electrically connected to a terminal to which a ground potential is input. The other terminal of the switch 51 is electrically connected to the other end of the inductor 53. An anode of the diode 52 is electrically connected to the other end of the inductor 53 and the other terminal of the switch 51. A cathode of the diode 52 is electrically connected to a terminal from which the direct-current voltage (Vout) is output. One electrode of the capacitor 54 is electrically connected to the terminal from which the direct-current voltage (Vout) is output. The other electrode of the capacitor 54 is electrically connected to the terminal to which the ground potential is input.

The DC-DC converter in FIG. 8B is a DC-DC converter controlled by feedback control with a pulse width modulation method (i.e., a step-up DC-DC converter controlled by a pulse width modulation method). In the DC-DC converter in FIG. 8B, as in the DC-DC converter in FIG. 8A, the direct-current voltage (Vout) can be fixed soon after the transconductance amplifier 101 or the like returns from the standby mode.

Example

Figure 9A:
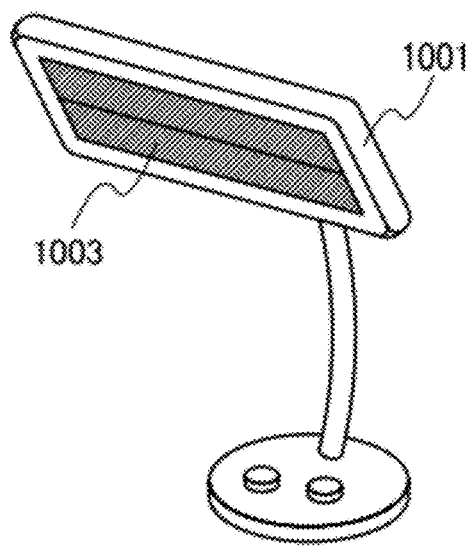
FIGS. 9A and 9B each illustrate an example of an electronic device.
Figure 9B:
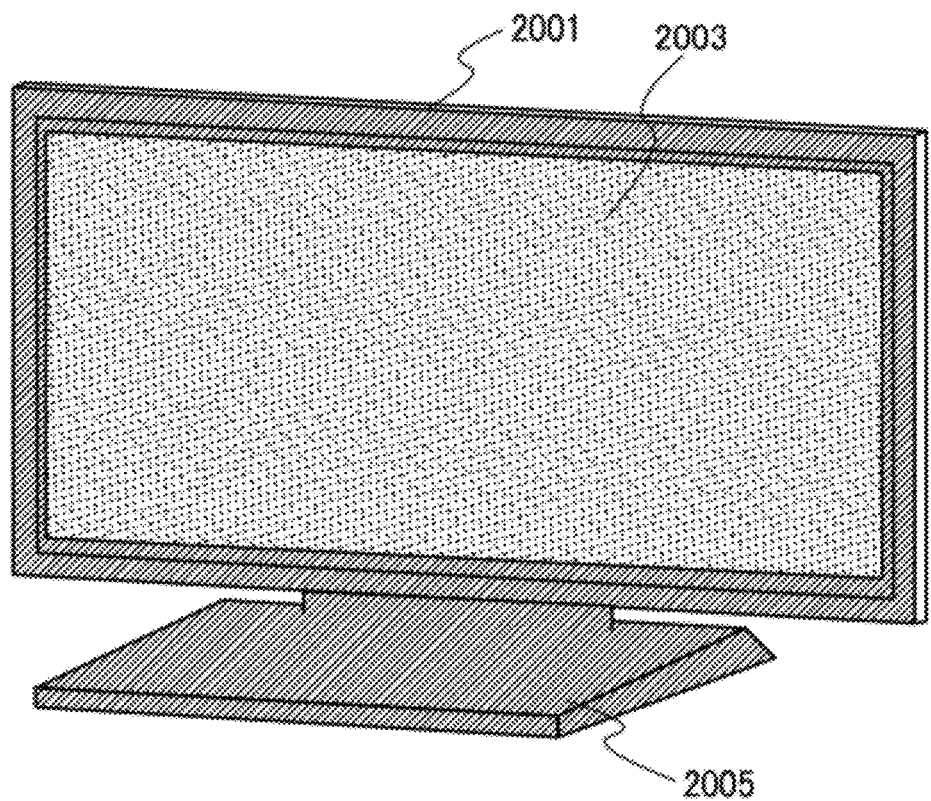

FIGS. 9A and 9B each illustrate an example of an electronic device including the above-described semiconductor device.

FIG. 9A illustrates a lighting device. The lighting device in FIG. 9A includes a housing 1001 and a lighting unit 1003. The semiconductor device is provided in the housing 1001. The provision of the semiconductor device makes it possible to suppress operation delay caused when the lighting device returns from a standby mode.

FIG. 9B illustrates a display device. The display device in FIG. 9B includes a housing 2001, a display portion 2003 incorporated into the housing 2001, and a stand 2005 for supporting the housing 2001. The semiconductor device is provided in the housing 2001. The provision of the semiconductor device makes it possible to suppress operation delay caused when the display device returns from a standby mode.

This application is based on Japanese Patent Applications serial No. 2011-102549 filed with Japan Patent Office on Apr. 29, 2011, the entire contents of which are hereby incorporated by reference.

What is claimed is:

1. A semiconductor device comprising:
a transconductance amplifier comprising an output terminal;
a transistor comprising:
a gate electrode,
an oxide semiconductor layer,
a gate insulating layer between the gate electrode and the oxide semiconductor layer, and
a source electrode and a drain electrode electrically connected to the oxide semiconductor layer,
a capacitor comprising a pair of electrodes; and
a node,
wherein the node is connected to the output terminal and one of the source electrode and the drain electrode, and
wherein one of the pair of electrodes is electrically connected to the other of the source electrode and the drain electrode.

2. The semiconductor device according to claim 1, wherein the other of the pair of electrodes is electrically connected to a wiring for supplying a fixed potential.

3. The semiconductor device according to claim 1,
wherein the transconductance amplifier further comprises a first input terminal and a second input terminal,
wherein a first signal is input to the first input terminal,
wherein a second signal is input to the second input terminal, and
wherein the transconductance amplifier is configured to amplify a difference between the first signal and the second signal.

4. The semiconductor device according to claim 1, wherein the oxide semiconductor layer comprises a rare gas in a source region and a drain region.

5. The semiconductor device according to claim 1, wherein the transistor further comprises a conductive layer overlapping the oxide semiconductor layer and the gate electrode.

6. The semiconductor device according to claim 1, wherein the semiconductor device is incorporated in a DC-DC converter.

7. A method for driving the semiconductor device according to claim 1, comprising the steps of:
turning off the transistor;
bringing the transconductance amplifier into a standby mode;
returning the transconductance amplifier from the standby mode; and
turning on the transistor.

8. The semiconductor device according to claim 1, wherein the node is directly connected to each of the output terminal and one of the source electrode and the drain electrode.

9. A semiconductor device comprising:
a power conversion unit configured to perform power conversion;
an output detection unit configured to generate a feedback signal based on an output of the power conversion unit; and
a control circuit unit configured to control the power conversion in accordance with the feedback signal,
wherein the control circuit unit comprises:
a transconductance amplifier comprising an output terminal;
a first transistor comprising:
a gate electrode,
a first oxide semiconductor layer,
a gate insulating layer between the gate electrode and the first oxide semiconductor layer, and
a source electrode and a drain electrode electrically connected to the first oxide semiconductor layer,
a capacitor comprising a pair of electrodes; and
a node,
wherein the node is connected to the output terminal and one of the source electrode and the drain electrode, and
wherein one of the pair of electrodes is electrically connected to the other of the source electrode and the drain electrode.

10. The semiconductor device according to claim 9, wherein the other of the pair of electrodes is electrically connected to a wiring for supplying a fixed potential.

11. The semiconductor device according to claim 9,
wherein the transconductance amplifier further comprises a first input terminal and a second input terminal,
wherein a first signal is input to the first input terminal,
wherein a second signal is input to the second input terminal, and
wherein the transconductance amplifier is configured to amplify a difference between the first signal and the second signal.

12. The semiconductor device according to claim 9, wherein the first oxide semiconductor layer comprises a rare gas in a source region and a drain region.

13. The semiconductor device according to claim 9, wherein the first transistor further comprises a conductive layer overlapping the first oxide semiconductor layer and the gate electrode.

14. The semiconductor device according to claim 9, wherein the semiconductor device is incorporated in a DC-DC converter.

15. The semiconductor device according to claim 9,
wherein the transconductance amplifier further comprises a first input terminal and a second input terminal,
wherein the control circuit unit further comprises a reference voltage generator configured to output a reference voltage,
wherein the output detection unit is electrically connected to the first input terminal, and
wherein the reference voltage generator is electrically connected to the second input terminal.

16. The semiconductor device according to claim 9,
wherein the transconductance amplifier further comprises a first input terminal and a second input terminal,
wherein the control circuit unit further comprises a reference voltage generator configured to output a reference voltage,
wherein the feedback signal is input to the first input terminal, and
wherein the reference voltage is input to the second input terminal.

17. The semiconductor device according to claim 9,
wherein the control circuit unit further comprises a pulse width modulator configured to output a control signal, and
wherein the pulse width modulator is electrically connected to the output terminal.

18. The semiconductor device according to claim 9,
wherein the control circuit unit further comprises a pulse width modulator configured to output a control signal,
wherein the power conversion unit further comprises a second transistor comprising a second oxide semiconductor layer, and
wherein the pulse width modulator is electrically connected to the second transistor.

19. A method for driving the semiconductor device according to claim 9, comprising the steps of:
turning off the first transistor;
bringing the transconductance amplifier into a standby mode;
returning the transconductance amplifier from the standby mode; and
turning on the first transistor.

20. The semiconductor device according to claim 9, wherein the node is directly connected to each of the output terminal and one of the source electrode and the drain electrode.

* * * * *